United States Patent [19]
Alizon et al.

[11] 4,148,016
[45] Apr. 3, 1979

[54] DIGITAL TO ANALOG AND ANALOG TO DIGITAL CONVERTERS USING CCD RAMP GENERATOR

[75] Inventors: Etienne Alizon; Jean E. Picquendar, both of Paris, France

[73] Assignee: Thomson-CSF, Paris, France

[21] Appl. No.: 698,784

[22] Filed: Jun. 22, 1976

[30] Foreign Application Priority Data

Jun. 27, 1975 [FR] France ................................ 75 20394

[51] Int. Cl.² ........................................... H03K 13/02
[52] U.S. Cl. ..................... 340/347 DA; 340/347 AD; 307/228; 364/858
[58] Field of Search ........................... 307/221 D, 228; 333/70 T; 357/24; 340/347 AD, 347 DA, 347 DD, 347 CC; 364/857, 858

[56] References Cited
U.S. PATENT DOCUMENTS

| 3,281,828 | 10/1966 | Kaneko | 340/347 AD |
| 3,313,922 | 4/1967 | Magnin | 340/347 DD |
| 3,408,595 | 10/1968 | Hillman | 340/347 AD |
| 3,419,784 | 12/1968 | Winn | 340/347 AD |
| 3,573,802 | 4/1971 | Kawashima | 340/347 AD |
| 3,597,693 | 8/1971 | McNeilly | 340/347 DA |
| 3,750,142 | 7/1973 | Barnes | 340/347 CC |
| 3,819,958 | 6/1974 | Gosney | 357/24 X |
| 3,942,035 | 3/1976 | Buss | 307/221 D |

Primary Examiner—Charles D. Miller
Attorney, Agent, or Firm—Cushman, Darby & Cushman

[57] ABSTRACT

The invention relates to ramp generators by which it is possible to obtain an electrical voltage which represents a ramp of a required form in dependence upon a given parameter. The invention comprises using a charge transfer device in which the charge transferred is measured in dependence upon a parameter associated with the weighting of the electrodes of the device. This weighting is fixed according to the required form of the ramp.

8 Claims, 9 Drawing Figures

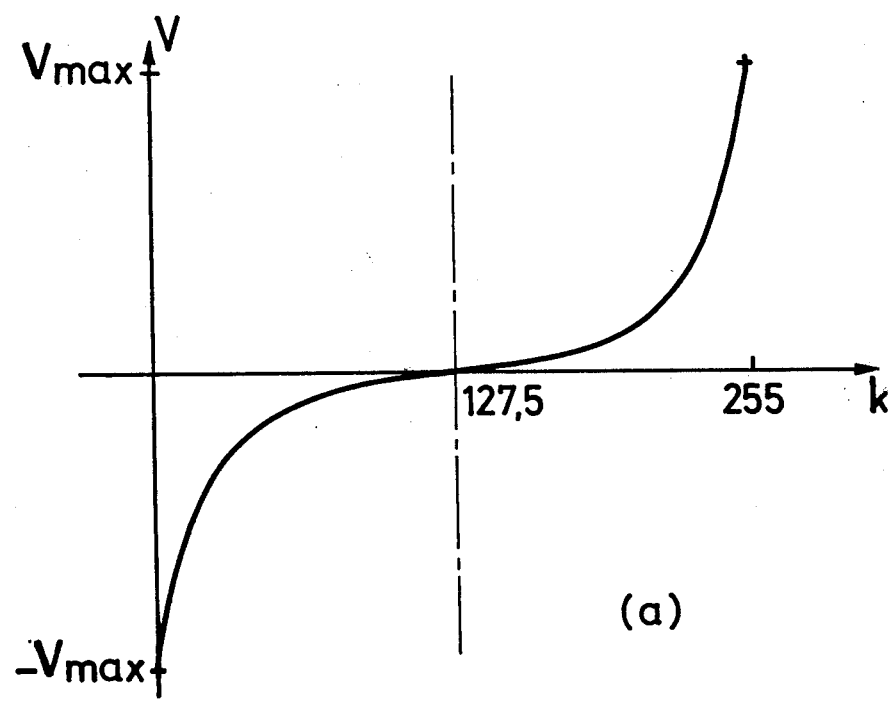
(a)
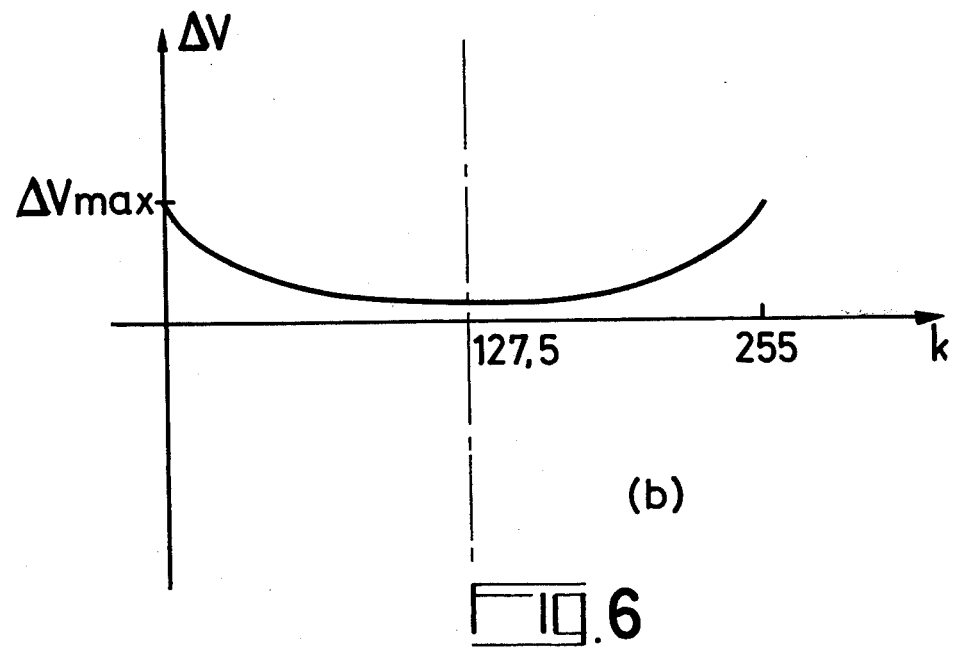
(b)
Fig. 6

DIGITAL TO ANALOG AND ANALOG TO DIGITAL CONVERTERS USING CCD RAMP GENERATOR

This invention relates to ramp generators by which it is possible to obtain an increasing or decreasing electrical voltage according to a given function of a parameter generally related to time. The invention also relates to the analog-digital and digital-analog converters which use a generator of this kind and also to telephonic encoders and decoders. According to a commonly used notation, these devices will be referred to hereinafter as A/D converters and D/A converters.

One known process for obtaining a voltage ramp of the kind in question comprises charging a capacitor with a current generator. The voltage at the terminals of this capacitor then increases linearly as a function of time. It is possible to obtain ramps of various forms by using networks of resistors and capacitors, although in general only an approximation of the required form is obtained and there is no general method for synthesising a network such as this from the required ramp form. In addition, all these processes are attended by the disadvantage that they are extremely sensitive to deviations of all kinds affecting the capacitors and feed voltages in particular.

It is known to construct charge-coupled devices (referred to in short as CCD or BBD depending on certain design features). These devices, which hereinafter will be referred to in short as CCD, comprise a series of electrodes deposited onto the surface of a semiconductor substrate. An electrical charge injected at one end of such a device may be transferred in the substrate from below one electrode to below the following electrode by applying to these electrodes control voltages varying in accordance with a suitable law. A description of these CCD, an account of their operation and the form to be given to the control voltages may be found in the article by Gilbert F. AMELIO entitled "Charge-Coupled Devices" published in Scientific American, volume 230, No. 2, February, 1974.

These devices are used in particular for constructing filters. To this end, the charge transferred from below one electrode to below the following electrode has to be measured in a weighted manner. A first method comprises dividing these electrodes into two sections of which the respective size corresponds to the weight attributed to the divided electrode and subsequently measuring in a differential manner the current supply to the two sections of the electrode by the transfer signal generators. A second method (adapted more especially to the so-called BBD) comprises using the voltage present at the electrodes during charge transfer for controlling circuits of which the impedance is governed by the weights allocated to the electrodes. These methods are described in the article by Dennis D. BUSS et al. entitled "Transversal Filtering Using Charge-Transfer Devices" published in IEEE Journal of Solid-State Circuits, Volume SC8, No. 2, April, 1973.

It is also known that the analog value of a given electrical voltage may be converted into a numerical value expressed in a binary code of any type in the form of a certain number of bits by counting the clock pulses emitted by a time base between the moment when a ramp generator of the kind in question is initialized and the moment when the value of the voltage of the ramp reaches said analog value. The result of this counting operation is a number which may be converted into the required code by means known per se. The relationship between the analog value and the numerical value will depend upon the form of the ramp supplied by the generator. In particular, for a linear ramp and for adequate proportionality coefficients, this numerical value may directly express in volts the analog value of the voltage. If, by contrast, this ramp is not linear, a code is obtained of which the expression will be governed by requirements. For example in the telephone technique known as pulse code modulation (PCM), a substantially exponential ramp may be adopted for taking into account the statistical distribution of the energy in the voice signals.

Conversely, a given numerical value expressed in a binary code of any kind in the form of a certain number of bits may be converted into an electrical voltage of which the analog value corresponds to this numerical value in accordance with a certain law by counting the clock impulses emitted by a time base from the moment when a ramp generator of the type in question is initialized When the number of these pulses, expressed in the same code as said numerical value, is identical with the number which expresses that value, the analog value of the voltage supplied by the ramp generator at that moment is the required value. This voltage may then be memorised, for example by using a known sample-and-hold circuit. In this case, too, the form of the ramp is determined in dependence upon the required encoding.

These various methods of D/A and A/D conversion are described in Herman SCHMID's book entitled "Electronic Analog/digital Conversions", published by Van Nostrand Rheinhold, New York, 1970.

In accordance with the present invention, it is provided a device for generating a ramp signal made of plateaus of variable height under the control of a clock signal marking a succession of steps, each of said plateaus corresponding to one of said clock steps, said device comprising :

a charge-coupled device (CCD) comprising an assembly of elementary cells, each of said elementary cells corresponding to one of said plateaus and being weight shaped in accordance with the heigh of said one plateau initializing means for injecting below the first one of said elementary cells a least one charge at a moment marking the beginning of said ramp, and determining said beginning by counting said clock steps;

means for generating under the control of said clock signal displacement signals for transferring said charge from below each of said elementary cells to below the next one of said elementary cells; and means for measuring during said transferring the value of said charge with the weighting in accordance with said next one of said elementary cells, and providing said ramp signal.

For a better understanding of the invention, and to show how the same may be carried into effect, reference will be made to the ensuing description and to the attached figures among which:

FIGS. 6a and 6b illustrate an extension law and its derivative;

Figure 7:
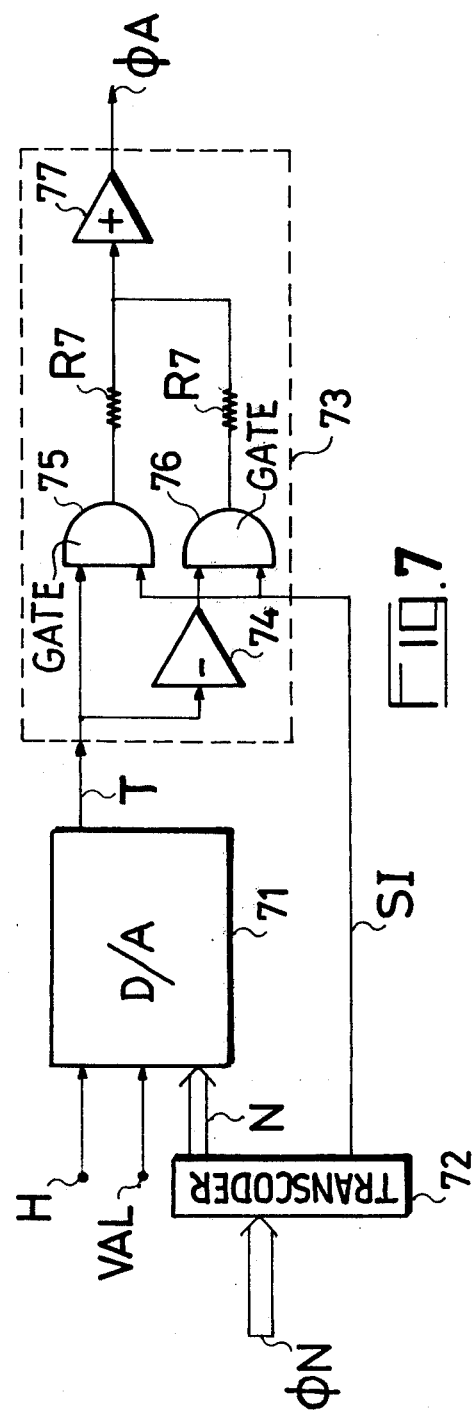
Figure 8:
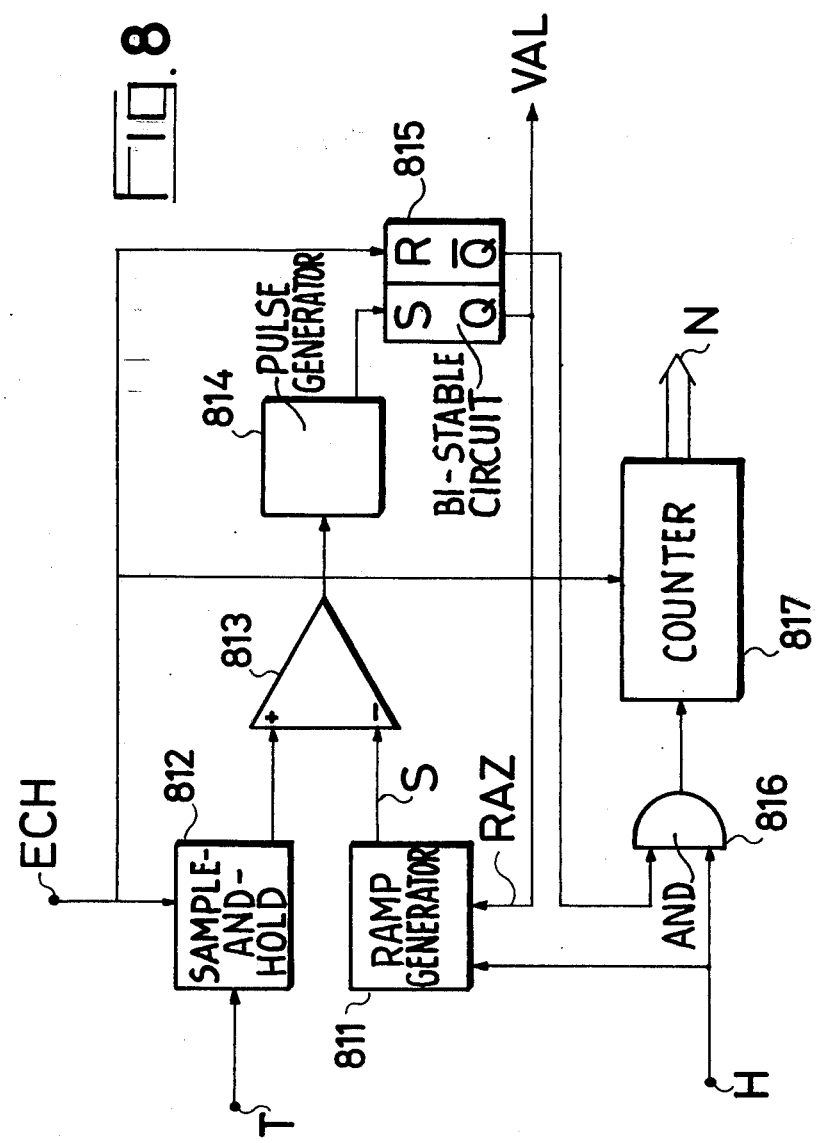
Figure 9:
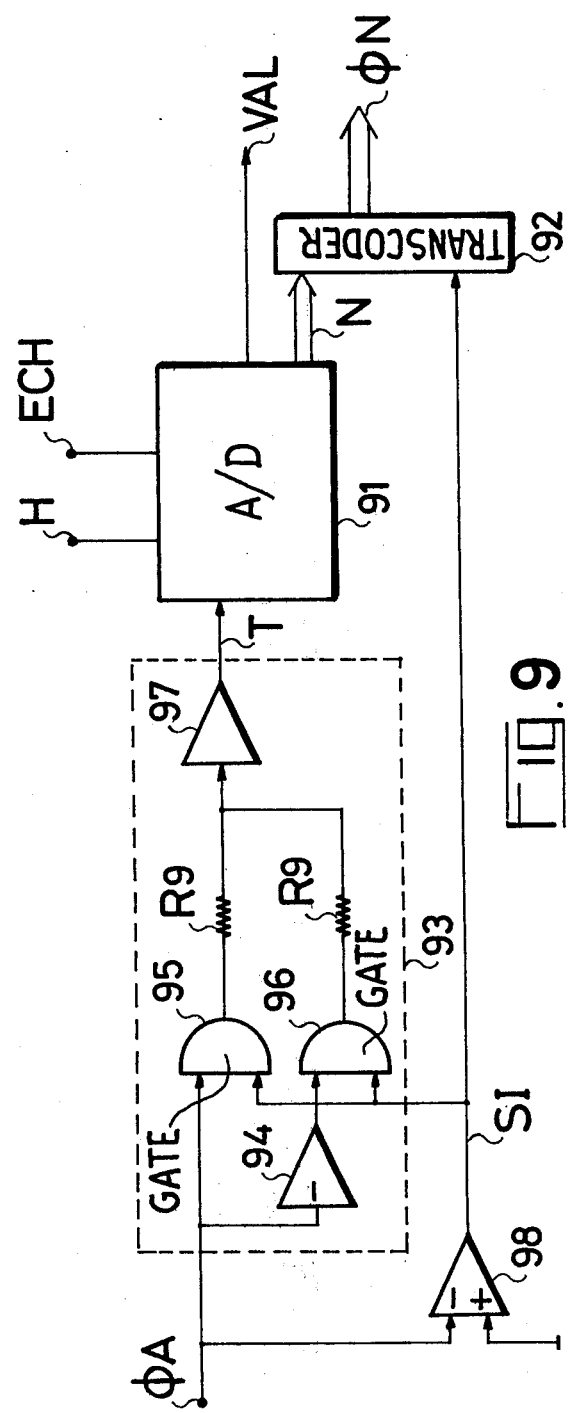

FIG. 7 illustrates a telephone decoder;
FIG. 8 illustrates an A/D converter;
FIG. 9 illustrates a telephone encoder.

Figure 1:
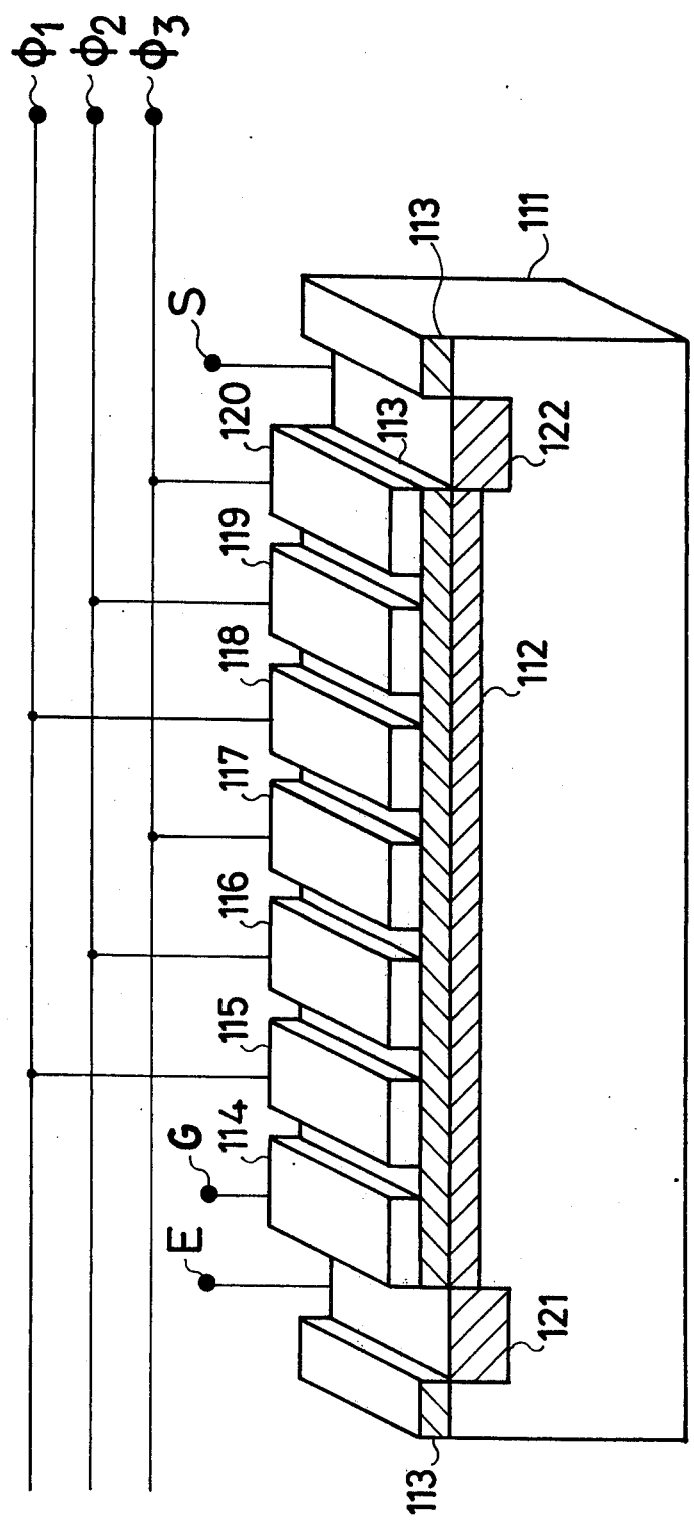
FIG. 1 illustrates a section through a charge-coupled device.

The CCD diagrammatically illustrated in section in FIG. 1 comprises, on a substrate 111 of P type silicon, a diffused layer 112 of type N covered with an insulating layer of silicon oxide 113. Electrodes 114 to 120 are deposited onto the insulating layer. The electrodes 115 to 120 are connected to the clock lines $\phi_1$, $\phi_2$ and $\phi_3$ in the order shown in the Figure relative to a conventional direction of displacement from left to right. The electrode 114 is connected to a connection G. Two regions 121 and 122 of the substrate are diffused more deeply in type N to form an input diode provided with a connection E and an output diode provided with a connection S.

The input diode is biased by a voltage applied to the connection E to form an electron source. A brief positive voltage pulse is applied to the connection G of the electrode 114, which forms an input gate, when the voltage applied to the clock line $\phi_1$ is at its maximum. This enables a certain number of electrons to be injected from the input diode to form an electrical charge below the electrode 115.

Figure 2:
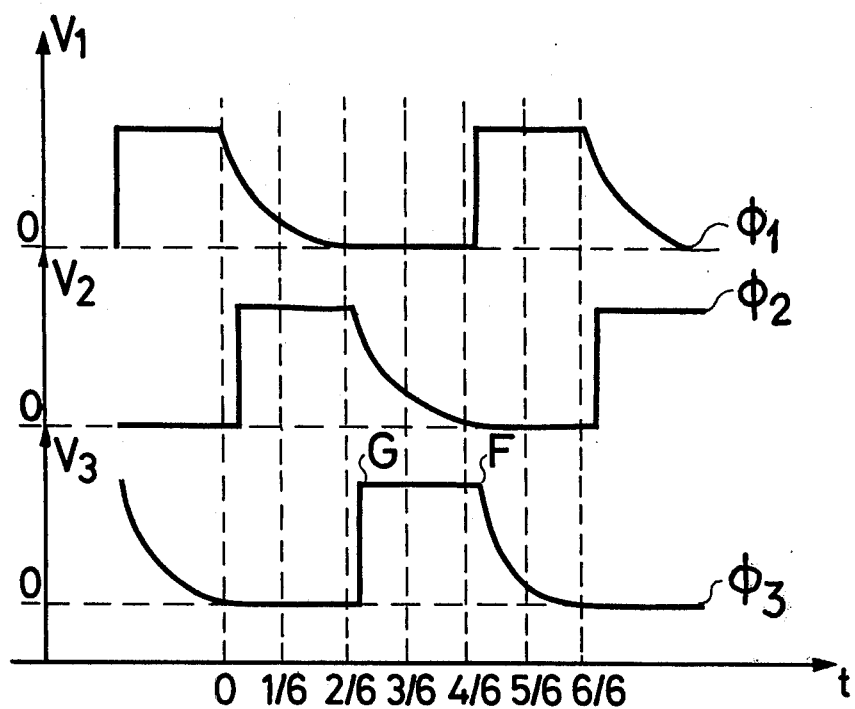
FIG. 2 illustrates the shape of the transfer signal.

To transfer the charge thus injected from the electrode 115 to below the electrode 120, voltages are applied to the clock lines $\phi_1$, $\phi_2$ and $\phi_3$. The amplitude of these voltages as a function of time is shown in FIG. 2, where the axis of the abscissae is graduated in one sixth of the duration of an elementary transfer cycle. This elementary transfer cycle enables said charge to be transferred from below the first electrode of an elementary cell made up of three electrodes (for example 115, 116 and 117) to below the first electrode of the following elementary cell (for example 118, 119 and 120). Thus, at the end of the first elementary cycle, the charge initially injected below the electrode 115 is situated below the electrode 118.

At the end of the following elementary cycle, the charge flows into the output diode and gives rise to a current in any circuit connected between the connection S and the substrate 111.

Figure 3:
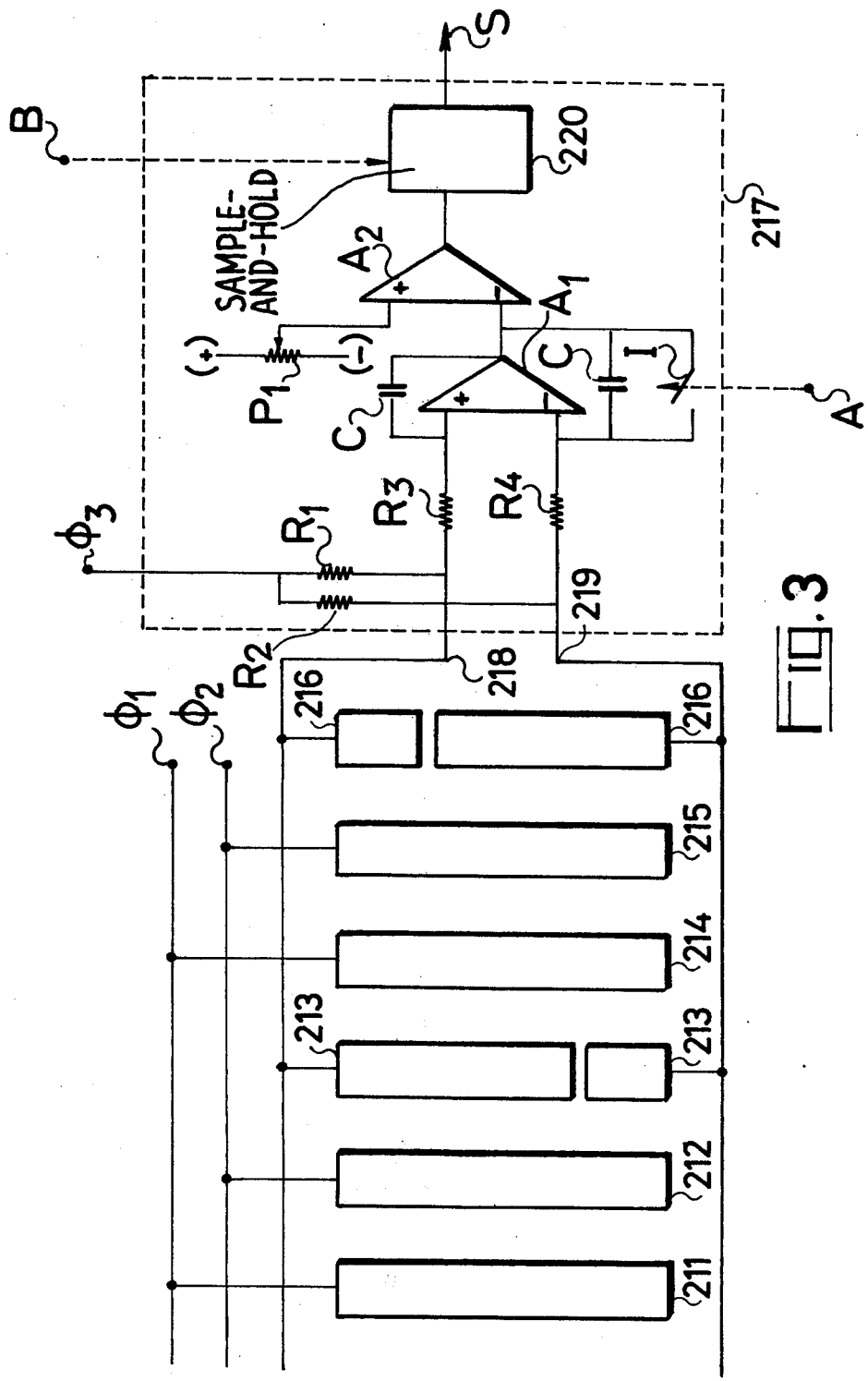
FIG. 3 illustrates a circuit diagram of a CCD with divided electrodes and a measuring circuit.

The CCD shown diagrammatically within the confines of the electrodes in FIG. 3 comprises two elementary cells composed of electrodes 211 to 216 and a measuring circuit 217. This measuring circuit 217 comprises for example 4 resistors $R_1$ to $R_4$, 2 amplifiers $A_1$ and $A_2$, 2 capacitors C, a switch I, a potentiometer $P_1$ and a sample-and-Hold circuit 220. This device receives transfer control signals, such as defined above, at the inputs $\phi_1$, $\phi_2$ and $\phi_3$ and measuring control signals at the inputs A and B. It emits a signal at the output S. This device has been shown with only two elementary cells in order to simplify both the drawing and the description, although it is by no means limited to this number.

The electrodes 213 and 216 are divided into two sections in the manner illustrated in the Figure. The upper sections are connected to a common clock line 218, whilst the lower sections are connected to a common clock line 219. These lines 218 and 219 receive transfer signals $\phi_3$ by way of the measuring circuit 217.

When the capacitance between an electrode and the layer of silicon where charge transfer takes place (112 in FIG. 1) is greater than the capacitance between that layer and the substrate (111 in FIG. 1), a situation which may readily be realized, the current which flows through the clock line to which this electrode is connected induces in the capacitor formed by this electrode and the substrate a charge which is proportional to the charge transferred below this electrode to the transfer layer. This charge may be measured by calculating the integral of the current in that line. The charge transferred below each section of the divided electrode is proportional to the surface area of that section and hence the integral of the difference between the currents in the clock lines 218 and 219 will be proportional to the difference between the surface areas of these sections, except for a constant due to parasitic capacitances.

If, therefore, a single charge is injected at the end of such a device, a signal proportional to the difference between the surface areas of the divided electrode situated in the cell where the charge arrives may be collected after each transfer of this charge from one elementary cell to the following elementary cell. If, with every charge transfer, a charge of same value is injected at the input of a device such as this, a signal proportional to the successive sum of the differences between the surface areas of the sections of the divided electrodes, under which the charges arrive, may be collected after each elementary transfer (corresponding to the displacement of all the charges of each elementary cell to the next).

By virtue of the measuring circuit 217, it is possible to apply the signal $\phi_3$ to the clock lines 218 and 219, to measure the integral of the difference between the currents in those two lines and to memorize the value of this integral between the significant times of the measurements. FIG. 3 shows one exemplary embodiment of a circuit such as this.

For this purpose, the signal $\phi_3$ being supplied by a generator of negligible impedance, the clock lines 218 and 219 are fed by two resistors $R_1$ and $R_2$ of the same value. The voltages at the terminals of $R_1$ and $R_2$ are therefore proportional to the currents in the lines 218 and 219. These voltages are applied by the resistors $R_3$ and $R_4$ to the positive and the negative inputs of the differential amplifier $A_1$. The function of the equally valued resistors is to isolate the lines 218 and 219 from the very low input impedance of the amplifier $A_1$. This amplifier is designed to function as a differential integrator in the usual way by means of capacitors C. The switch I, which is shown symbolically in the Figure, but which due to the rapidity of the phenomena is formed by means of a static device, such as a field effect transistor, is used to discharge the capacitor $C_1$ after each elementary transfer in order to reinitialize the integrator and to allow the following integration.

The output of the amplifier $A_1$ is connected to the negative input of a differential amplifier $A_2$ of which the positive input is connected to a potentiometer $P_1$ fed between a positive potential (+) and a negative potential (−) relative to earth in respect of the device. The gain of this amplifier is controllable by internal means known per se. The potentiometer $P_1$ enables the operating threshold of the amplifier $A_2$ to be regulated so that it is possible in particular to compensate the integration constant due to the parasitic capacitances in the CCD device.

The connections of the amplifiers $A_1$ and $A_2$ may be reversed so that an output signal with the desired polarity is obtained.

The output of the amplifier $A_2$ is connected to the sample-and-hold circuit 220. This circuit, known per se, samples the value of the voltage at the output of $A_2$ under the control of a signal applied at B and memorizes that value whilst at the memorized time applying to the output S a voltage of identical value which is available under a relatively low impedance.

Referring to FIG. 2, the switch I is closed for a brief instant at the time 2/6 under the effect of a control pulse arriving at the input A. The capacitor C discharges and the integrator is thus reset to zero. This capacitor is charged between the moment where the voltage on $\phi_3$ increases after the time 2/6 (point G) and the moment when it commences to fall again after the time 4/6 (point F). Throughout this time, the voltage of the output of $A_1$ is proportional to the integral of the difference between the currents in the connections 218 and 219. At the moment when this current is reversed (point F), i.e. when charge transfer begins in the following elementary cell, a brief control pulse at the input B enables the value of the voltage to be memorised in the 220 circuit.

A signal made up of a number of plateaus is ultimately obtained at the output S, each plateau corresponding to an elementary transfer cycle.

There shall be defined for each plateau a coefficient $h_k$ standardised to unity, zero for a medium division and such that that section of the electrode connected to the line 218 represents $100/2 (1 + h_k)$ % of the surface area of that electrode, whilst that section connected to the line 219 represents $100/2 (1 - h_k)$ % of that surface area. This coefficient expresses in percent the difference between the surface areas of the two sections and, in cases where a single charge is injected, is thus proportional to the voltage present at S after an elementary transfer cycle bringing said charge under the $k^{th}$ electrode.

Starting from a function V(x), which it is desired to obtain in ramp form, it is sufficient to quantify this function from n successive values of x and to standardise to unity the values $V(x_k)$ thus obtained by ratioing them to the value $|V(x)|_{MAX}$. It is possible in this way to obtain n values between $-1$ and $+1$ which represent n coefficients $h_k$. By virtue of these coefficients it is possible to construct a CCD which may be used to generate a ramp of the kind in question. It is desirable for two electrodes divided according to two separate coefficients be distinguished from one another and lead to different output signals, allowing for production tolerances. This imposes a lower limit upon the difference between two such coefficients. It is in fact generally the maximum value of the function which compresses these differences and this requirement is generally based on the ratio $$\frac{|V(x)|MIN}{|V(x)|MAX}$$

which does not have to be too low to be distinct from zero, allowing for production tolerances.

If the negative and positive extrema of the function are not equal in module, and more especially if the module of one of them is much greater than that of the other, the distribution of the divisions of the electrodes will not extend from one end of one to the end of another, which is unfortunate in view of this limitation of the differences between the coefficients. A disadvantage such as this may be overcome by effecting a change of origin of the ordinates on the function V(x) and by compensating the voltage differential thus obtained, for example by acting on the potentiometer $P_1$. A solution such as this is applicable in particular to the case of a strictly positive function.

If a charge of the same value is injected at the input of the CCD with each elementary displacement, the value of the output voltage of S on the $p^{th}$ displacement will be, $\alpha$ being a numerical coefficient:

$$V_s(p) = \alpha \sum_{k=1}^{k=p} h_k$$

Accordingly, it is possible by this method of injection to obtain a ramp reproducing a function V(x) quantified from n values, provided that the values $\Delta V(x_k) = V(x_k) - V(x_{k-1})$ are assigned to the coefficients $h_k$ because, as the first of the injected charges progresses through the CCD the weighted signals obtained from successive elementary cells combine to give the output signal.

This method of injection is particularly interesting in cases where $\Delta V_{MAX}$ is distinctly below $V_{MAX}$. It is thus possible to obtain a better distribution of the divisions of the electrodes because it is the highest coefficient which compresses the differences between the others and this compression is not desirable for the reasons explained above.

It is pointed out that this inequality relation is expressed in the same way, taking into account the function V(X) and its derived function in relation to x.

If, for example, the coefficients $h_k$ are all equal to 1, which corresponds to the case where the electrodes are not divided at all (i.e. simple method of construction), a stepped ramp which corresponds to a linear function V(x) is obtained by continuously injecting charges. In cases where a single charge has been injected, it would have been necessary, in order to obtain a ramp such as this, to divide the various electrodes according to an increment of 1/n, which would require a precision of this division distinctly greater than 1/n, i.e. difficult to obtain. In this case, however, when the first of the charges injected reaches the end of the device, there is no further variation in the signal and it is then necessary to stop injection and to continue the displacement until the last charge injected reaches the end of the circuit. Accordingly, as many displacements are necessary for emptying the device as were necessary for generating the ramp, although a ramp which is symmetrical with the first and which may be useful is obtained during this emptying time. It is also possible to switch the clock frequency and to empty the CCD much more quickly than it was filled.

Figure 4:
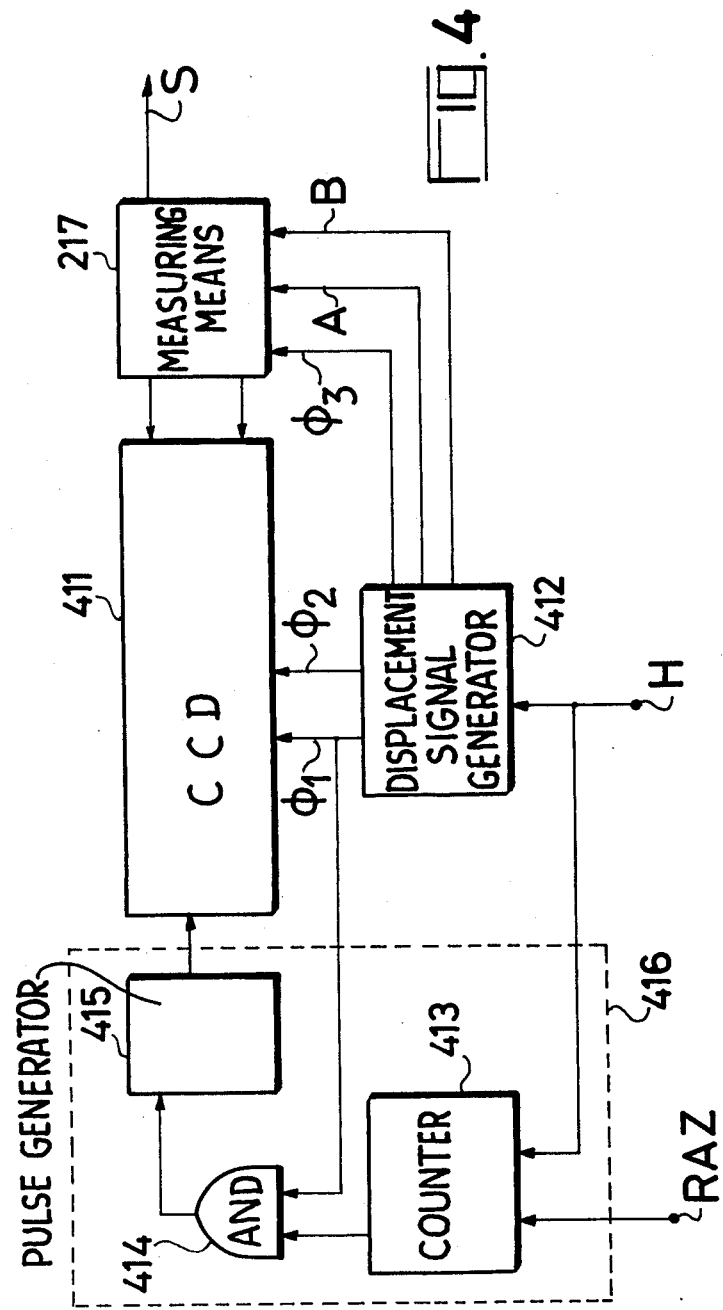
FIG. 4 illustrates the circuit diagram of a ramp generator.

The ramp generator shown in FIG. 4 comprises a CCD device 411, measuring means 217, initializing means 416 and a displacement signal generator 412. It receives clock signals at its input H and a zeroising signal at its input RAZ. It supplies a voltage ramp at its output S.

The CCD device 411 and the measuring means 217 are of the type previously described in reference to FIG. 3. The electrodes of the device 411 are divided to obtain the type of ramp desired.

The displacement signal generator 412 receives clock impulses marking a succession of steps at its input H and supplies signals $\phi_1$, $\phi_2$, and $\phi_3$ similar to those illustrated in FIG. 2, for example by using monostable circuits for suitably offsetting the clock impulses as a function of time and RC circuits for obtaining signal slopes in the required form. It also supplies the signals A and B used by the measuring means 217, for example by effecting a logic combination of the signals $\phi_1$, $\phi_2$ and $\phi_3$.

The initializing means 416 send an injection signal to the CCD 411 each time it is necessary to inject a charge.

To this end they count the clock pulses which indicates to them the injection instants, taking into account the phase of the signal $\phi_1$. A zeroising signal applied to the input RAZ enables injection to be stopped, which after the device 411 has been emptied results in the appearance of a zero signal at the output S as long as this zeroising signal remains applied.

The initializing means 416 may comprise for example a counter 413, an AND gate 414 and a pulse generator 415. As long as the zeroising signal is present at the input RAZ, the counter 413 is inhibited and no charge is injected at the input of the device 411. Accordingly, the signal at S is zero. When the signal at RAZ is relaxed, the counter 413 counts the clock pulses. Decoding (in this case internal) of the states of this counter gives a signal for the state 1 (single injection) or for the states 1 to n (continuous injection), n being the number of cells of the device 411. Combination of this signal with the transfer signal $\phi_1$, in the AND gate 414 enables an initialization signal of correct phase to be obtained. It is also possible to manage without this intermediary by carefully selecting the shape of the clock signals. This initialization signal relaxes the pulse generator 415 (for example a monostable circuit) so that it sends an injection signal to the device 411 (a pulse on the connection G of the gate 114 shown in FIG. 1 for example).

The counter 413 has n stages where a single charge is injected, so that a succession of identical ramps will in this case be available at S in the absence of a signal at RAZ.

The counter 413 has $2 \times n$ stages where charges are continuously injected, in which case a succession of rising and then falling (or vice versa) ramps will be available at S in the absence of a signal at RAZ.

Accordingly, the signal at RAZ is only useful when it is desired to stop the output of the ramp signal for a certain time in order to restart the system with a correct phase relative to an outside phenomenon for example. In a case such as this, it is even possible to use a counter with n stages for continuous injection, stopping it for at least n clock steps by an external signal applied to RAZ.

Figure 5:
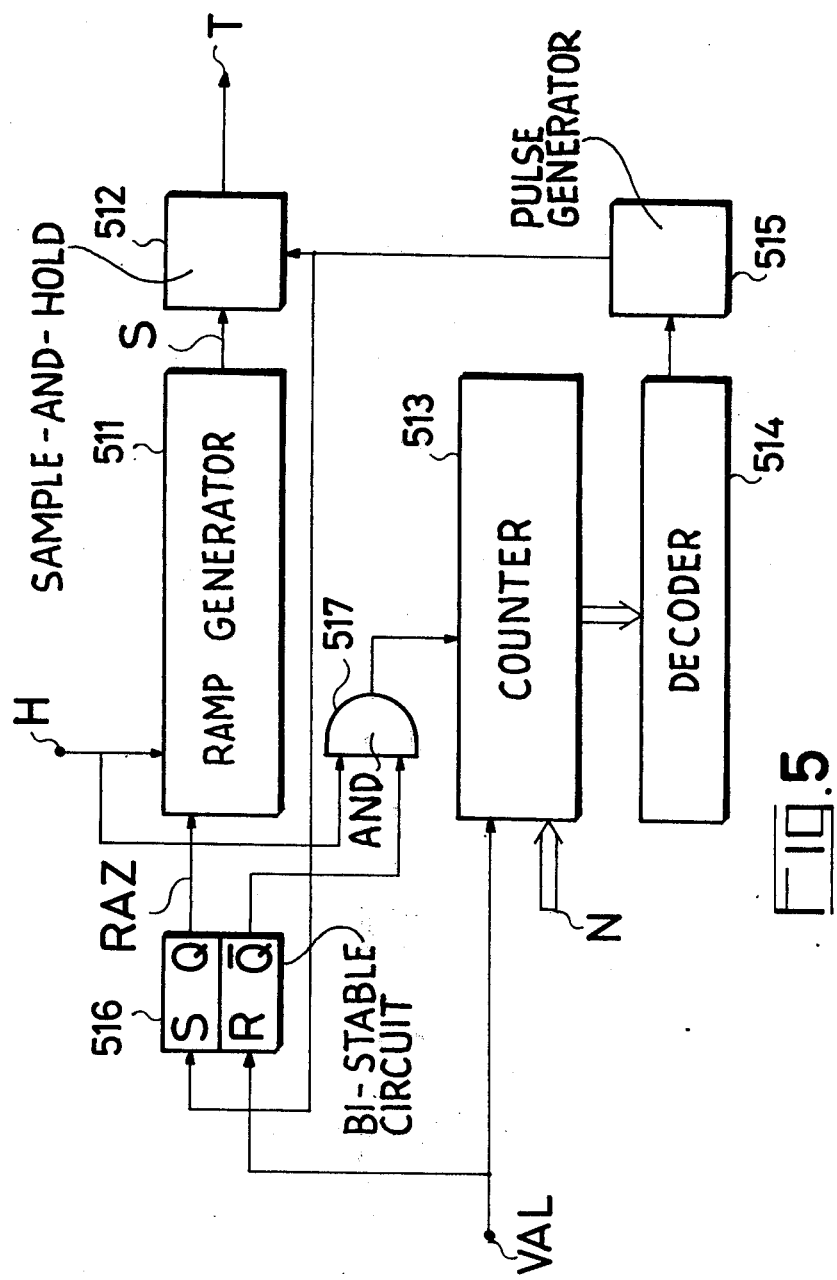
FIG. 5 illustrates an D/A converter.

FIG. 5 diagrammatically illustrates an D/A converter comprising a ramp generator 511 of this type, a sample-and-hold circuit 512; a counter 513, a decoder 514 and a pulse generator 515 forming counting means; a bi-stable circuit 516 and an AND gate 517 forming control means.

The generator 511 permanently receives clock pulses at its input H. Outside conversion periods, the trigger circuit 516 maintains a zeroising signal at the input RAZ of the generator 511 which enables a zero signal to be obtained at the output S of that generator.

To this end, the trigger circuit 516 is a trigger circuit of the conventional RS type which obeys the law $S = 1 \rightarrow Q = 1$ and $R = 1 \rightarrow \bar{Q} = 1$, taking the signals active according to a positive logic which is standard (i.e. the generator 511 is blocked by $\bar{Q} = 1$).

The numerical signal to be converted, which we shall assume to be present in the desired code in the form of a number p composed of m bits in parallel, is applied to the input N of the counter 513. At the same time, a validation signal is applied to the input VAL of this counter which positions it in a state representing p.

This validation signal is also applied to the input R of the bistable circuit 516 which switches, Q passing to the state 0 and $\bar{Q}$ to the state 1. The zeroising signal at RAZ is thus cancelled and the gate 517 is open. The generator 511 thus begins to generate a ramp at its output S and the counter 513, receiving a controlled clock signal by the AND gate 517, functions.

This counter 513 functions as a backward counter, in other words starting from the number to be converted its state decreases by 1 unit with each clock pulse. When this state reaches zero, i.e. when the clock has supplied p pulses both to the counter 513 and to the ramp generator 511, the decoder 515 decodes this state and brings the pulse generator 515 into operation. This generator, for example a monostable circuit, sends a stop signal in the form of a brief pulse to the sample-and-hold circuit 512 and also th the input S of the bistable circuit 516.

The sample-and-hold circuit 512, of the same type as the 220 circuit shown in FIG. 3, samples the value of the ramp signal at S at this instant and memorizes it by presenting it under low impedance to the output T of the D/A converter. The value of the output signal at T is thus the value of the function V on the basis of which the generator 511 was constructed after p clock steps, i.e. V(p). Accordingly, a numerical value p has been converted into a voltage V according to an arbitrary law V(p).

The bistable circuit 516 switches back under the effect of the stop signal to resume its initial state $W = 1$ and $Q = 0$, which recloses the gate 517 and causes the generator 511 to be reset to zero. This resetting to zero lasts for a time $n - p$ (single charge) or n (continuous injection, and allowance is made for this limitation at the level of the apparatus which supply the number p applied to N and the validation signal applied to VAL.

The conversion law may be arbitrarily selected during the construction of the CCD device used in the ramp generator, given the necessary technological possibilities. These possibilities are essentially linked to the positioning tolerances of the divisions in the electrodes: It is possible in particular to use a recommended extension law for converting the numerical PCM telephone signals into voice signals. A law such as this is for example the standardised ECFT extension law (ECFT = European Conference for Telecommunications) shown qualitatively in FIG. 6a. To each integer k on the abscissa there corresponds an output voltage V which, standardised in relation to the maximum voltage $V_{MAX}$, directly gives the weighting coefficient which enables the corresponding electrode of the CTD device to be formed. This law is anti-symmetrical in relation to an axis passing through the abscissa point 127. 5 and parallel to the axis of the ordinates. The coefficients thus obtained vary in module from 1 (for $k = 255$ and $k = 0$) to 1/2048 (for $k = 127$ and $k = 128$), which where a single charge is injected would result in extremely critical formation of the elctrodes. The derived law of this ECFT law, shown qualitatively in FIG. 6b, gives the variation $\Delta V$ in the output voltage for each integer k on the abscissa. This variation $\Delta V$, standardised in relation to the maximum variation $\Delta V_{MAX}$, gives the weighting coefficient for producing the corresponding electrode in the case of continuous charge injection. The coefficients thus obtained vary in module from 1 (for $k = +255$ and $k = 0$) to 1/64 (for $k = 127$ and $k = 128$), which enables the electrodes to be readily produced and justifies the recourse to continuous charge injection.

The anti-symmetry of the extension law also provides for a simplification, because it is sufficient to form the CCD of the ramp generator in such a way that it generates a ramp representing half the curve situated on one side of the anti-symmetry axis, for example the curve corresponding to the abscissae comprised between 127.

5 and 255. The CCD then comprises half as many elementary cells and, to each number k between 128 and 255, there will be made to correspond the number k between 0 and 127 for which the output voltage is of like module, but of opposite sign. An inverter will supply the correct voltage.

A correspondence such as this between the numbers is easy to obtain because, taking the representation in pure binary code of 8 bits of numbers from 0 to 255, then:

0 → 0 0 0 0 0 0 0 0
127 → 0 1 1 1 1 1 1 1
128 → 1 0 0 0 0 0 0 0
255 → 1 1 1 1 1 1 1 1

Since the correspondence is as follows:

0 → 255
1 → 254
...
127 → 128 it is sufficient to take the bit of heavy weight (first on the left) as representing the sign of the output voltage of the converter, and the remaining 7 bits as representing the module of that voltage (taking into account the extension law) by inverting the 7 module bits for the numbers from 0 to 127. In this case, the correspondence is as follows:

0 → 0 1 1 1 1 1 1 1
127 → 0 0 0 0 0 0 0 0
128 → 1 0 0 0 0 0 0 0
255 → 1 1 1 1 1 1 1 1

Transcoding such as this is obtained by conventional methods using combinations of logic circuits, but in fact the numbers are often directly supplied in this code by standard numerical telephone hardware and in this case may be directly used as such.

It is also possible and advisable to use this simplification and the continuous injection of charges in combination with one another. FIG. 7 diagrammatically illustrates a telephone decoder designed in accordance with these principles. This decoder comprises a digital-/analog converter 71, a transcoder 72 and a polarity-reversing circuit 73.

The transcoder 72 receives the numerical telephone signals in the form of 8 bits in parallel at its input φ N. It converts these signals into the sign plus module code defined above and transmits the 7 module bits to the input N of the N/A converter and the sign bit to the circuit 73 by the connection SI. If the signals arrive at φ N in the sign plus module form, transcoding is reduced to a simple coupling of the wires transmitting the bits.

The D/A converter 71 is similar to that illustrated in FIG. 5. It permanently receives clock signals at its input H. These clock signals are delivered to it at a sufficient frequency to enable the decoder to convert each value of the numerical telephone signal before the arrival of the following signal. The telephone hardware supplying these telephone signals also supply a validation signal which is applied to the input VAL of the converter 71 and which enables decoding to be initialized when the digital telephone signal has a significant value. This D/A converter 71 converts the digital module signal presented in the form of 7 parallel bits at the input N by the transcoder 72 into an analog signal available at its output T. This conversion takes place in accordance with the ECFT extension law shown in FIG. 6a and confined to the part situated on the right of the anti-symmetry axis. To this end, the ramp generator of the D/A converter comprises a CCD with 128 elementary cells weighted by the following coefficients:

cells 1 to 32 → coefficient 1/64
cells 33 to 48 → coefficient 1/32
cells 49 to 64 → coefficient 1/16
cells 65 to 80 → coefficient 1/8
cells 81 to 96 → coefficient 1/4
cells 97 to 112 → coefficient 1/2
cells 113 to 128 → coefficient 1

These coefficients comply with the definition given above. They are calculated for the continuous injection of charges and, hence, from the derived law shown in FIG. 6b. It is not possible in this case to make a change of origin of the ordinates on this law to distribute the divisions over the entire length of the electrodes, because the constant thus integrated would modify the gradient of the final curve.

The signal issuing from the converter 71 is thus of constant polarity. This polarity is or is not reversed by the circuit 73, depending upon the state of the numerical sign signal present in the connection SI. This circuit 73 comprises for example an inverter 74, two analog gates 75 and 76, two resistors R7 and a summator 77.

The signal present at the output T of the converter 71 is directly applied to the gate 75 and to the inverter 74 which is an amplifier of gain $-1$. The output of this inverter is applied to the gate 76. The gates 75 and 76 function oppositely to one another, in other words the same signal opens one and closes the other. They may be formed for example by field effect transistors with inverse and complementary characteristics. They receive as control signal the sign bit by the connection SI, optionally with level adaptation. The summator 77 receives the signals issuing from the gates 75 and 76 by way of decoupling resistors R7 of equal value; it is an operational amplifier connected to function as a summator of which the gain may be used to obtain the required output level; it delivers the analog telephone signal to the output φ A.

FIG. 8 diagrammatically illustrates an A/D converter comprising a ramp generator 811, a sample-and-hold circuit 812, a comparator 813 and a pulse generator 814 forming comparison means; a bistable circuit 815 and an AND gate 816 forming control means; and a counter 817.

The generator 811 is of the type previously described in reference to FIG. 4, and it permanently receives clock signals at its input H. Outside the conversion periods, the bistable circuit 815 maintains a zeroising signal at the input RAZ of the generator 811, which enables a zero signal to be obtained at the output S of that generator.

To this end, the bistable circuit 815 is a bistable circuit of the conventional RS type which obeys the law $S = 1 \rightarrow Q = 1$ and $R = 1 \rightarrow Q = 1$, taking the signals active in accordance with a positive logic, which is standard practice (thus the generator 811 is blocked by $Q = 1$).

The analog signal to be converted is applied to the input T of the A/D converter. A sampling pulse is applied simultaneously to the sample-and-hold 812, to the counter 817 and to the input R of the bistable circuit 815 at the instant when the analogue signal has to be converted by the connection ECH. This pulse activates the sample-and-hold 812 which samples the value of the analog signal at this instant and memorises it whilst at the same time applying it to the positive input of the comparator 813. This same pulse zeroises the counter 817 and switches the bistable circuit 815 of which the output Q passes to the state 0 and the output Q to the state 1.

The zeroising signal at RAZ is thus cancelled and the gate 816 is open. The generator 811 thus begins to generate a ramp at its output S and the counter 817, which receives the controlled clock signal via the AND gate 816, is activated. The states of this counter are presented in parallel at the digital output N.

The ramp present at the output S is applied to the negative input of the comparator 813. This comparator is a known circuit of which the inputs function in an analog mode and the output in a logic mode. The state of its output changes by passing from a logic level to another logic level when the difference between the voltages at its positive and negative inputs changes sign, irrespective of the common value of these voltages during this change of sign. Thus, when the value of the ramp voltage at S reaches or exceeds the value of the analog signal memorised in the sample-and-hold 812, the output of the comparator 813 changes state.

This change of state causes relaxation of the pulse generator 814, for example a monostable circuit, of which the input is connected to the output of the comparator 813 and its output to the input S of the bistable circuit 815. It delivers a stop signal.

This bistable circuit switches back under the effect of the stop signal, its output Q passes to the state 1, which stops the ramp generator 811, whilst its output Q passes to the state 0, which closes the gate 816.

Since it no longer receives the clock pulses, the counter 817 stops and its states remain fixed at the value p of the number of clock steps counted from initialization to the moment when the value of the ramp has reached or exceeded (whence the quantification error) the value of the analog signal. Accordingly, a voltage V has been converted into a digital value p in accordance with an arbitrary law p (V).

This digital value is present at the output N and the state of the output Q of the trigger circuit 815 is applied to the output VAL so as to indicate to the users of the digital signal that it may be used at the output N.

The conversion law for an A/D converter such as this may be arbitrarily selected with the limitations already mentioned and providing it is unequivocal with respect to the construction of the CCD used in the ramp generator. In particular, it is possible to use a compression law for converting the voice signals into PCM telephone signals. A law such as this is for example the standardised ECFT law which is the law opposite to that used in the decoder described above.

It is pointed out that the A/D converter thus described functions by comparison between the value of the analog signal to be converted and the value of an analog signal supplied by a ramp generator which in fact performs the function of a D/A converter. As a result, the conversion law to be used for constructing the ramp generator is not the compression law, but the opposite law, i.e. the extension law described above. Thus, all the considerations, in particular of amplitude, anti-symmetry and transcoding apply directly in the case of a telephone encoder in the same way as in the case of a decoder.

FIG. 9 diagrammatically illustrates an encoder of this kind which comprises an A/D converter 91, a transcoder 92, a polarity reversing circuit 93 and a comparator 98.

The polarity-reversing circuit 93 receives analog telephone signals at its input φA. These signals are symmetrical in relation to earth and their polarity is thus alternately positive and negative. This polarity is or is not reversed by the circuit 93 according to the state of the sign signal present in the connection SI, so that signals of constant polarity are delivered to the input T of the converter 91. It functions in the same way as the circuit 73 of the decoder shown in FIG. 7 and may thus comprise the same elements.

The control signal of this circuit 93 is supplied by the comparator 98 of which the output is connected to the connection SI. This comparator is similar to the comparator 813 of the A/D converter shown in FIG. 8. It functions in the same way and compares the signal at φA with the earth potential, supplying a logic state resulting from this comparison and hence from the polarity of the signal at φA.

The direction of the connection to the inputs of this comparator, such as illustrated in FIG. 9, is purely illustrative and is governed essentially by the manner in which its output signals are used.

The A/D converter 91 is similar to that shown in FIG. 8. It permanently receives clock signals at its input H. These clock signals are delivered at a sufficient frequency to enable the encoder to convert the analog telephone signal at the necessary frequency for the hardware for which these coded signals are intended. The telephone hardware receiving these coded signals also supplies a sampling signal which is applied to the input ECH of the converter 91. The converter 91 receives the constant polarity signals to be converted at its input T and at its output N supplies a digital module signal of 7 bits corresponding to the conversion of the input signal at T in accordance with the ECFT compression law limited in dependence upon its anti-symmetry characteristics. To this end, the ramp generator of the A/D converter comprises a CCD which is entirely similar to that described for the decoder illustrated in FIG. 7 for the reasons already explained. For each conversion cycle, the converter 91 also supplies a validation signal at its output VAL when encoding is complete. This signal is intended for the telephone hardware which receive and use the coded signal.

The transcoder 92 receives the digital signals emanating from the output N of the converter 91 and the digital sign signal present in the connection SI. It transcodes these signals into a digital telephone signal of 8 bits according to the required code and delivers this signal at its output φN. If the required code is in sign plus module, this transcoding is reduced to a simple coupling of the wires transmitting the bits.

The invention is by no means confined to the examples described above. Thus, it is possible to use a single ramp generator both for an encoder and for a decoder and even for several encoders and decoders by combining them through an assembly of logic circuits and by using a sufficiently rapid clock sequence. In addition, it is also possible to use an external weighting technique for the electrodes, known per se, instead of the weighting technique using divided electrodes.

What we claim is:

1. A digital-analog converter for converting a digital signal consisting of n bits into an analog signal, which comprises:

means for counting an external clock signal composed of pulses, and delivering a stop signal when the count obtained is equal to the value of said digital signal;

a charge coupled device comprising a plurality of cells weighted according to a given conversion law;

means for injecting into said charge-coupled device at least one charge when said counting means is actuated;

means for displacing, under the control of said external clock signal, said charge along said charge-coupled device under said weighted cells;

means for measuring weighted signals induced into said weighted cells during the displacement of said charge, and providing a ramp signal; and a sample-and-hold circuit for sampling said ramp signal under the control of said stop signal, and delivering said analog signal.

2. A digital-analog converter as claimed in claim 1, further comprising means for controlling the actuation of said counting means under the control of an external validation signal.

3. A digital-analog converter as claimed in claim 2, wherein said injecting means inject one charge during each one of said pulses of the clock signal.

4. A digital-analog converter as claimed in claim 3, further comprising means for transcoding n−1 bits of said digital signal into a transcoded signal, and means for inverting said analog signal under the control of the last other bit of said digital signal; said transcoded signal being applied to said counting means.

5. An analog-digital converter to converting an analog signal into a digital signal consisting of n bits, which comprises:

a sample-and-hold circuit for sampling said analog signal, and providing a sample signal;

a charge-coupled device comprising a plurality of cells weighted according to a given conversion law;

means for injecting into said charge-coupled device at least one charge;

means for displacing, under the control of an external clock signal composed of pulses, said charge along said charge-coupled device under said weighted cells;

means for measuring weighted signals induced into said weighted cells during the displacement of said charges, and providing a ramp signal;

means for comparing said coupled signal and said ramp signal, and delivering a validation signal; and means for counting said external clock signal, and delivering said digital signal under the control of said validation signal.

6. An analog-digital converter as claimed in claim 5, further comprising means for controlling, under the control of an external sampling signal, the actuation of said sample-and-hold circuit and of said injecting means, and the resetting of said counting means.

7. An analog-digital converter as claimed in claim 6, wherein said injecting means inject one charge during each one of said pulses of the clock signal.

8. An analog-digital converter as claimed in claim 7, further comprising means for inverting said analog signal into an inverted analog signal under the control of one of said n bits of the digital signal, and means for transcoding the other n−1 bits of said digital signal into a transcoded signal; said inverted signal being applied to said sample-and-hold circuit.

* * * * *